United States Patent
Stalder

(12) 
(10) Patent No.: US 6,519,840 B1
(45) Date of Patent: Feb. 18, 2003

(54) APPARATUS AND METHOD FOR MOUNTING SEMICONDUCTOR CHIPS ON A SUBSTRATE

(75) Inventor: Roland Stalder, Zürich (CH)

(73) Assignee: ESEC Trading SA, Cham (CH)

( * ) Notice: Subject to any disclaimer, the term of this patent is extended or adjusted under 35 U.S.C. 154(b) by 0 days.

(21) Appl. No.: 09/562,237

(22) Filed: Apr. 28, 2000

(30) Foreign Application Priority Data

Apr. 30, 1999 (CH) .................................. 799/99

(51) Int. Cl.⁷ .................................. H05K 3/30
(52) U.S. Cl. .................. 29/833; 29/832; 29/834; 29/836; 29/593; 29/740
(58) Field of Search .................. 29/832, 833, 834, 29/836, 593, 740, 729

(56) References Cited

U.S. PATENT DOCUMENTS

| | | | | |
|---|---|---|---|---|
| 4,472,218 A | * | 9/1984 | Avedissian et al. | 156/64 |
| 4,667,402 A | | 5/1987 | Wilde | 29/840 |
| 4,850,780 A | * | 7/1989 | Safabakhsh et al. | 414/417 |
| 5,249,356 A | * | 10/1993 | Okuda et al. | 29/833 |
| 5,384,956 A | * | 1/1995 | Sakurai et al. | 29/834 |
| 5,579,572 A | * | 12/1996 | Kashiwagi et al. | 29/836 |
| 6,006,426 A | * | 12/1999 | Kira et al. | 29/836 |
| 6,178,626 B1 | * | 1/2001 | Hada et al. | 29/833 |
| 6,185,816 B1 | * | 2/2001 | Freund et al. | 29/833 |
| 6,266,873 B1 | * | 7/2001 | Kitamura et al. | 29/532 |

FOREIGN PATENT DOCUMENTS

EP  0 565 781  4/1992

* cited by examiner

*Primary Examiner*—Timothy V. Eley
*Assistant Examiner*—David Nguyen
(74) *Attorney, Agent, or Firm*—McCormick, Paulding & Huber LLP

(57) ABSTRACT

An apparatus for mounting semiconductor chips on a substrate with which the semiconductor chips are presented on a foil clamped in a frame at a first location A comprises a chip gripper for the transport of the semiconductor chip presented at the first location A to a second location located on the substrate, a movable table for accepting the frame, a chip ejector arranged underneath the foil at the first location A the upper surface of which facing towards the foil has holes connected to a vacuum source, as well as a measuring camera directed at the first location A for establishing the position of the presented semiconductor chip. Correction of a possible position deviation of the presented semiconductor chip from its set position takes place in accordance with the invention in that the foil is secured by the chip ejector by means of vacuum and then at least the upper surface of the chip ejector facing towards the foil is moved in the plane running parallel to the under side of the foil.

11 Claims, 1 Drawing Sheet

APPARATUS AND METHOD FOR MOUNTING SEMICONDUCTOR CHIPS ON A SUBSTRATE

BACKGROUND OF THE INVENTION

Figure 1:
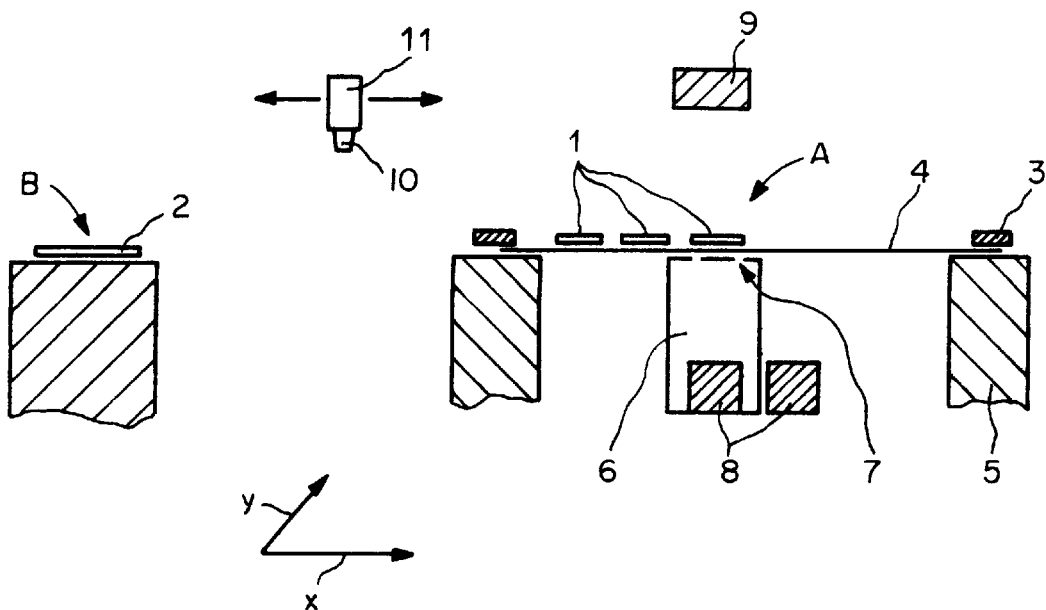

The invention concerns an apparatus for mounting semiconductor chips on a substrate which is suitable for mounting semiconductor chips which adhere to a foil clamped into a frame. The invention further concerns a method for mounting semiconductor chips on a substrate.

With such an apparatus, the frame with the foil is accepted by a movable table. The table is moved in cycles so that one semiconductor chip after the other is presented at a first location A and the presented semiconductor chip is then picked by chip gripper and placed on a substrate at a second location B. By means of a measuring camera directed at the first location A, the position of the presented semiconductor chip is measured before removing it from the foil and the deviation of the position from its set position is established and a correction vector is determined. The following methods are known for the correction of the established deviation:

1. After establishing the deviation, however before removal of the presented semiconductor chip from the foil, the table is moved by the correction vector. This method is implemented on one of the machines introduced to the market by the applicant.
2. The correction of the deviation takes place by means of a corrective movement of the chip gripper and/or by means of a corrective movement of the substrate. This method is implemented on a machine newly launched by the applicant.

The removal of the presented semiconductor chip from the foil is supported by a chip ejector (known also as a die ejector) arranged underneath the foil. Removal of the semiconductor chip takes place in that the foil is sucked onto and secured by the chip ejector by means of vacuum and in that subsequently, optionally, a needle penetrating the foil from underneath pushes the semiconductor chip against the suction opening of the chip gripper.

When now, in accordance with the first method mentioned above, the table is moved by the correction vector, then the friction between the foil and the chip ejector can lead to the position of the semiconductor chip still deviating by some micrometres from the set position after the corrective movement. The foil lies namely with a certain weight on the chip ejector. With small corrective movements which amount to only a few micrometres, the friction between the foil and the chip ejector now has the effect that with such small correction movements the foil does not follow the movement of the table but simply stretches.

With the second method, the necessary accuracy for placement of the semiconductor chip on the substrate can be achieved, however the solution is technically very expensive.

The object of the invention is to overcome the disadvantages of the prior art.

BRIEF DESCRIPTION OF THE INVENTION

An apparatus for mounting semiconductor chips on a substrate, with which the semiconductor chips on a foil clamped in a frame are presented at a first location A, comprises a chip gripper for the transport of the semiconductor chip presented at the first location A to a second location located on a substrate, a movable table for acceptance of the frame, a chip ejector arranged underneath the foil at the first location A the upper surface of which facing the foil has a hole connected to a vacuum source, as well as a measuring camera directed at the first location A for establishing the position of the presented semiconductor chip. The correction of a possible position deviation of the presented semiconductor chip from its set position takes place in accordance with the invention in that the foil is secured by the chip ejector by means of vacuum and then at least the upper surface of the chip ejector facing the foil is moved in the plane running parallel to the underneath of the foil.

BRIEF DESCRIPTION OF THE DRAWING FIGURES

In the following, embodiments of the invention are explained in more detail based on the drawing.

It is shown in:

FIG. 1 an apparatus for mounting semiconductor chips 1, and

Figure 2:
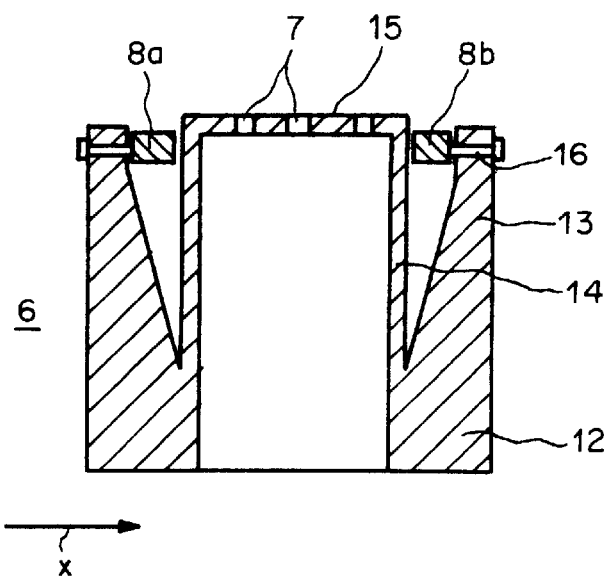

FIG. 2 a chip ejector.

DETAILED DESCRIPTION OF THE INVENTION

FIG. 1 shows a simplified, schematic presentation of an apparatus for mounting semiconductor chips 1 on a substrate 2. The semiconductor chips 1 arranged in rows and columns adhere to a foil 4 clamped in a frame 3. The apparatus has a movable table 5 which accepts the frame 3 and presents one semiconductor chip 1 after the other at a first location A. At the first location A, a chip ejector 6 is arranged underneath the foil 4. On removal of the semiconductor chip 1, the chip ejector 6 serves to support its detachment from the foil 4. The chip ejector 6 has holes 7 which are connectable to a vacuum source. The chip ejector 6 is movable in two orthogonal directions x and y by means of two drives 8. The foil 4 is arranged so that the columns and rows of the semiconductor chips 1 are approximately parallel to the directions x and y. Furthermore, the apparatus has a measuring camera 9 directed at the first location A for establishing the position of the presented semiconductor chip 1 as well as a chip gripper 10 for the transport of the semiconductor chip 1 presented at the first location A to a second location B located on the substrate 2. The chip gripper 10 is a component part of a raisable and lowerable bondhead 11. The bondhead 11 and the chip gripper 10 are moved together backwards and forwards between location A and location B.

In each working cycle, the apparatus works according to the following steps:

A. Movement of the table 5 for the presentation of a new semiconductor chip 1 at location A, whereby a certain position deviation from the set position is permissible.

B. Suction and securing of the foil 4 by means of applying vacuum to the holes 7 of the chip ejector 6;

C. Establishing the actual position of the semiconductor chip 1 by means of the measuring camera 9;

D. Determining the correction vector which represents the deviation of the established actual position of the semiconductor chip 1 from its set position at location A;

E. Corrective movement of the chip ejector 6 by the correction vector; and

F. Removal of the semiconductor chip 1 from the foil 4.

The movement of the table 5 in step A takes place based on assessed values $v_x$ and $v_y$, which correspond to the average distance between a reference point of adjacent semiconductor chips 1 in x direction and in y direction. The distance between adjacent semiconductor chips 1 is subject to deviations because the foil 4 is expanded each time when clamping the frame 3 on the table 5. As it can readily happen that a foil 4 is clamped in the table 5 and removed again several times, the position of the semiconductor chip 1 established in step C can deviate from its set position in x and/or y direction by up to 20 µm. The presentation of the semiconductor chip 1 at location A therefore takes place typically with an accuracy of approximately 20 µm.

When the semiconductor chips 1 are removed from the foil 4 alternately from left to right and then from right to left, then the table 5 is advantageously not moved in step A by the vector v=($v_x$, $v_y$), which points from the reference point of the semiconductor chip 1 just processed to the reference point of the next semiconductor chip 1 to be processed, but by the vector v+k, whereby k denotes the correction vector of the last semiconductor chip 1 processed. It has been proved that the maximum deviation of the position to be corrected as established in step C is reduced to approximately 5 µm when the position deviation established for the previous semiconductor chip 1 is also taken into consideration for the movement of the table 5 in step A. With this operating method, the presentation of the semiconductor chip 1 at location A takes place with an improved accuracy of approximately 5 µm.

The sequence in which the semiconductor chips 1 are processed can be set on the apparatus. The semiconductor chips 1 can, as mentioned, be processed alternately from left to right and then from right to left. However, they can also be processed always from left to right, or always from top to bottom, or alternately from top to bottom and then from bottom to top. With these variations, the maximum deviation of the position to be corrected as established in step C can also be reduced to around 5 µm when a corresponding correction vector k is used for the movement from the processed semiconductor chip 1 to the next semiconductor chip 1.

In the event that the semiconductor chips are to be processed in a random sequence corresponding to given criteria and to the information about the semiconductor chips stored in a database known as a "wafermap", then it can be advantageous to save the correction vector established for the semiconductor chip actually being processed in the database so that it can be taken into consideration when presenting the next semiconductor chip which is located near to this semiconductor chip. The movement to the next semiconductor chip can therefore take place in consideration of the correction value nearest to the semiconductor chip.

For the correction of smaller deviations which lie in the range of 0 up to around 5 µm, a chip ejector 6 can then be used with which the corrective movement takes place by means of piezoelectric drives 8. Such a chip ejector 6 is presented in FIG. 2. The chip ejector 6 has a housing 12 with a spherical, rigid outer wall 13 and a spherically formed inner wall 14 movable in relation to the outer wall 13. The housing 12 and both walls 13, 14 are for example produced from one piece as a turned part. The space within the inner wall 14 is connected to the vacuum source each time when the foil 4 (FIG. 1) is to be sucked and secured onto the upper surface 15. Two piezoelectric drives 8a and 8b, the resting position of which in relation to the x direction is adjustable by means of screws 16, are envisaged for movement of the upper surface 15. By means of the two drives 8a and 8b, the end of the inner wall 14 facing the upper surface 15 is connected to to the outer wall 13 without play. The two piezoelectric drives 8a and 8b are electrically connected in opposition so that they move in the same direction when a voltage is applied to move the upper surface 15 in x direction. Two further piezoelectric drives for movement of the upper surface 15 in y direction are not shown. With a further embodiment, only one single piezoelectric drive, eg, drive 8a, is available for the movement in x direction. In this case, the drive 8a is firmly connected to the outer wall 13 as well as to the inner wall 14, e.g. by means of adhesive.

If the position deviation established in accordance with step C of the above method should once be greater than the maximum position deviation which can be overcome by the chip ejector 6, then, instead of step D, the vacuum must be released again and the process started again from step A, whereby in step A the table 5 is moved by the correction vector established from the position deviation.

The apparatus described is above all suitable for automatic assembly machines with which the substrate 2 (FIG. 1) is placed in feed direction with sufficient accuracy at location B at which the chip gripper 10 deposits the semiconductor chip, or with which a possible deviation in the position of the substrate 2 from its set position can be corrected by the apparatus envisaged for the feed of the substrate 2.

In order to keep possible position deviations of the semiconductor chip 1 placed on the substrate 2 as small as possible, it is further possible to establish the position of the semiconductor chip 1 placed onto the substrate 2 by means of a second measurement camera, to calculate, preferably with statistical methods, a further correction vector h from the possible position deviations of the placed semiconductor chip 1 which represents a measure for possible deviations from location B for the semiconductor chip (1) already placed on the substrate (2) and to carry out a corrective movement of the chip ejector 6 in step E of the procedure given above which corresponds to the sum of the correction vector established in step D and the correction vector h.

What is claimed is:

1. Method for mounting semiconductor chips one after the other on a substrate, whereby a plurality of semiconductor chips stick on a foil clamped in a frame and whereby in a working cycle a table accepting the frame is moved in order to present a semiconductor chip at a first location and a chip gripper grips the semiconductor chip presented at the first location and transports it to a second location located on the substrate, the method compring the steps of:
    a. Moving the table to present a new semiconductor chip at the first location, whereby a certain position deviation from a set position is permissible;
    b. Suction and securing of the foil on a surface of a chip ejector facing the foil;
    c. Establishing an actual position of the semiconductor chip with a measuring camera directed at the first location;
    d. Determining a correction vector which represents a deviation of the established actual position of the semiconductor chip from its set position at the first location;
    e. Moving the chip ejector by the correction vector: and
    f. Removing the semiconductor chip from the foil.

2. Method according to claim 1, wherein the presentation of the semiconductor chip in step A takes place under consideration of the correction vector established in step D of a previous or an earlier working cycle.

3. Method according to claim 1, wherein in step e, in addition to the corrective movement of the chip ejector by the correction vector established in step d, a corrective movement of the chip ejector takes place which takes a further correction vector into consideration which represents a measure for possible position deviations of the semiconductor chips already placed on the substrate.

4. Apparatus for mounting semiconductor chips on a substrate, the apparatus comprising

- a table for the acceptance of a frame, the frame clamping a foil which contains a plurality of semiconductor chips, the table being movable to present one semiconductor chip after the other at a first location;
- a measuring camera directed at the first location for establishing a position of the presented semiconductor chip,
- a chip ejector arranged underneath the foil at the first location the upper surface of which facing the foil hats holes connectable to a vacuum source for securing the foil to the chip ejector,
- drive means for moving at least the upper surface of the chip ejector facing the foil in a plane running parallel to an under side of the foil for the correction of a possible position deviation of the presented semiconductor chip from a set position; and
- a chip gripper for the transport of the semiconductor chip presented at the first location to a second location located on the substrate.

5. Apparatus according to claim 4, wherein a working cycle it carries out at least the following steps:

a. Movement of the table for the presentation of a new semiconductor chip at the first location, whereby a certain position deviation from the set position is permissible;

b. Suction and securing of the foil onto the surface of the chip ejector facing the foil;

c. Establishing the actual position of the semiconductor chip by means of the measuring camera;

d. Determining a correction vector which represents a deviation of the established actual position of the semiconductor chip from its set position at the first location;

e. Corrective movement of the chip ejector by the correction vector, and f. Removal of the semiconductor chip from the foil.

6. Apparatus according to claim 5, wherein the movement of the table in step A takes place in consideration of the correction vector established in step D of a previous or an earlier working cycle.

7. Apparatus according to claim 5, wherein in step e, in addition to the corrective movement of the chip ejector by the correction vector established in step d, a corrective movement of the chip ejector takes place which takes a further correction vector into consideration which represents a measure for possible position deviations of the semiconductor chips already placed on the substrate.

8. Apparatus according to claim 4, wherein piezoelectric drives are provided for the corrective movement of the chip ejector.

9. Apparatus according to claim 5, wherein piezoelectric drives are provided for the corrective movement of the chip ejector.

10. Apparatus according to claim 6, wherein piezoelectric drives are provided for the corrective movement of the chip ejector.

11. Apparatus according to claim 7, wherein piezoelectric drives are provided for the corrective movement of the chip ejector.

* * * * *

UNITED STATES PATENT AND TRADEMARK OFFICE
CERTIFICATE OF CORRECTION

PATENT NO.    : 6,519,840 B1
DATED         : February 18, 2003
INVENTOR(S)   : Roland Stalder It is certified that error appears in the above-identified patent and that said Letters Patent is hereby corrected as shown below:

Column 4,
Line 46, "compring" should read -- comprising --.

Column 5,
Line 16, "hats" should read -- has --.

Signed and Sealed this

Eighth Day of July, 2003

JAMES E. ROGAN
*Director of the United States Patent and Trademark Office*